United States Patent [19]

Lommers et al.

[11] 3,812,434

[45] May 21, 1974

[54] INTEGRATED DIFFERENTIAL AMPLIFIER

[76] Inventors: Anthonius Johannes Josephus Cornelis Lommers; Adrianus Joannes Maria Van Alphen, both of Emmasingel, Eindhoven, Netherlands

[22] Filed: Oct. 4, 1972

[21] Appl. No.: 294,913

[30] Foreign Application Priority Data

Oct. 9, 1971 Netherlands ...................... 7113892

[52] U.S. Cl. .................... 330/19, 330/29, 330/30 D

[51] Int. Cl. .......................... H03f 3/42, H03g 3/30

[58] Field of Search .......... 330/19, 30 D, 38 M, 69, 330/29

[56] References Cited

UNITED STATES PATENTS 3,445,780 5/1969 Beelitz ................................ 330/69

3,684,974 8/1972 Solomon et al. ................. 330/30 D

*Primary Examiner*—H. K. Saalbach

*Assistant Examiner*—Lawrence J. Dahl

*Attorney, Agent, or Firm*—Frank R. Trifari; Bernard Franzblau

[57] ABSTRACT

An integrated difference amplifier comprising a gain controlled first differential amplifier arrangement which is suitable for amplifying signals of low value and a satisfactory signal-to-noise ratio. In case of an increasing signal intensity the first differential amplifier arrangement is cut off and the signal amplification is taken over by a second differential amplifier arrangement which is suitable for processing large signal amplitudes.

11 Claims, 2 Drawing Figures

INTEGRATED DIFFERENTIAL AMPLIFIER

Figure 1:
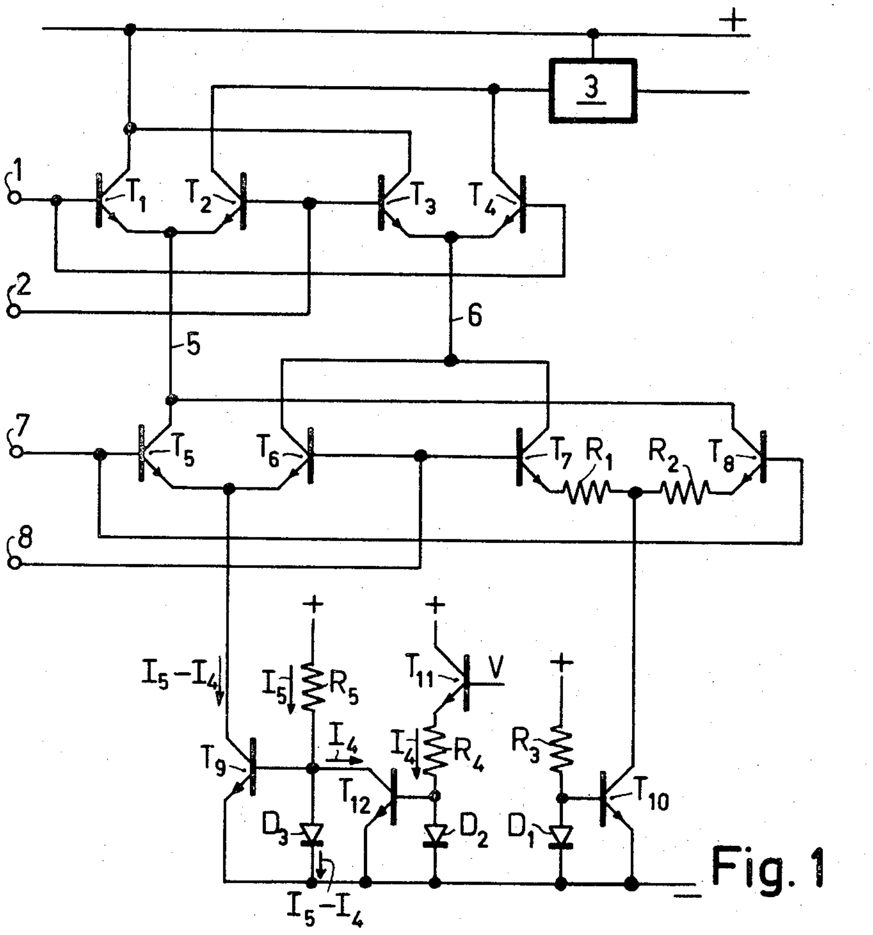

The invention relates to an integrated differential amplifier including first and second transistors arranged in a long-tailed pair configuration having interconnected emitter electrodes, means for applying the signal to be amplified between the base electrodes of said transistors, a third transistor whose collector is connected to the said emitter electrodes and means connected to the base electrode of the third transistor for reducing the direct current flowing through said third transistor with increasing input signal intensity.

Differential amplifiers are often used in integrated circuits. An important use is in integrated superheterodyne receivers including local oscillators and double-balanced mixer stages for converting the received signals into an intermediate frequency signal. The required selectivity is brought about by an intermediate frequency filter arranged after the mixer stage, which filter is followed by an aperiodically integrated IF amplifier having a very large amplification. In such circuits it is necessary in practice to use a double-balanced mixer stage, for otherwise either the local oscillator voltage or the signal voltage appears at the input of the IF filter, reaches the input of the aperiodical amplifier through parasitic reactances of the IF filter, subsequently undergoes a large amplification and is fed back from the output of this amplifier through parasitic couplings to the aerial input of the receiver or otherwise and thus produces parasitic oscillations or disturbs the automatic gain control.

The use of a double-balanced mixer stage necessitates, however, the control of this stage with the aerial signal through a balanced differential amplifier.

Therefore it is important to have a differential amplifier which can be suitably formed in an integrated embodiment and which provides eminently balanced signals. However, since it must be possible to receive very weak input signals and very strong input signals, this differential amplifier must also be able to amplify the very weak input signals with a reasonable signal-to-noise ratio and a large amplification factor and process the strong input signals without distortion.

An object of the invention is to provide a differential amplifier of this kind and to this end the amplifier according to the invention further comprises a fourth transistor whose base electrode is connected to the base electrode of the first transistor and whose collector electrode is connected to the collector electrode of the first transistor, and a fifth transistor whose base electrode is connected to the base electrode of the second transistor and whose collector electrode is connected to the collector electrode of the second transistor, the emitter electrodes of said fourth and fifth transistors being connected to substantially equal emitter resistors.

In case of very weak signals the first and second transistors are completely or mainly operative for the signal amplification. Due to the directly coupled emitter electrodes of these transistors a large signal amplification with a satisfactory signal-to-noise ratio is obtained. As the input signals increase, the current in the third transistor is reduced so that the amplification of the first and second transistors decreases in known manner. These transistors cannot, however, process strong input signals sufficiently without distortion because the input signals are completely present across the two non-linear emitter-base junctions of these transistors.

The emitter resistors and the direct current of the fourth and fifth transistors are chosen, or are controlled as a function of the input signal intensity, so that these fourth and fifth transistors completely or substantially completely handle the signal amplification before the first and second transistors start to produce inadmissible signal distortion. The said fourth and fifth transistors may then be adjusted at a suitably chosen constant direct current, but the emitter resistors are preferably connected to the collector electrode of a sixth transistor which is cut off in case of weak input signals and conveys a direct current which increases as the input signal intensity increases. As a result of the foregoing, the emitter resistors of the fourth and fifth transistors, as well as the transistors themselves, will not deteriorate the signal-to-noise ratio of the entire amplifier in case of weak signals.

Figure 2:
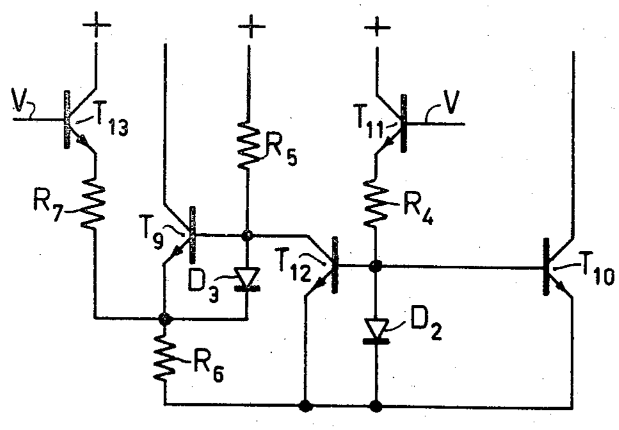

The invention will further be described with reference to the Figures shown in the accompanying drawing in which:

FIG. 1 shows an embodiment of an integrated difference amplifier according to the invention and FIG. 2 shows a modification of the embodiment of FIG. 1.

FIG. 1 shows a double-balanced mixer stage having four transistors $T_1$, $T_2$, $T_3$ and $T_4$. The base electrodes of $T_1$ and $T_4$ are connected together and to an input terminal 1 and the base electrodes of $T_2$ and $T_3$ are likewise connected together and to an input terminal 2. The output signal from a local oscillator (not shown) is applied between the terminals 1 and 2.

The collector electrodes of $T_2$ and $T_4$ are jointly connected to an intermediate frequency filter 3 and the collector electrodes of $T_1$ and $T_3$ are connected to the positive terminal (+) of a supply voltage source not further shown.

The emitter electrodes of $T_1$ and $T_2$ are jointly connected to a line 5 and the emitter electrodes of $T_3$ and $T_4$ are jointly connected to a line 6. When phase-opposed currents of the aerial signal are supplied through the lines 5 and 6, only mixed products of the aerial signal and the local oscillator signal appear at the input of filter 3 while these two signals themselves do not occur at the input of the filter.

The said phase-opposed currents are obtained with the aid of four further transistors $T_5$, $T_6$, $T_7$ and $T_8$, the collector electrodes of $T_5$ and $T_8$ being jointly connected to the line 5 and the collector electrodes of $T_6$ and $T_7$ being jointly connected to the line 6. The base electrodes of $T_5$ and $T_8$ are jointly connected to an input terminal 7 and the base electrodes of $T_6$ and $T_7$ are jointly connected to an input terminal 8. The received aerial signal is applied in a manner not further shown between the input terminals 7 and 8.

The emitter electrodes of $T_5$ and $T_6$ are jointly connected to the collector electrode of a direct current source transistor $T_9$ and the emitter electrodes of $T_7$ and $T_8$ are jointly connected to the collector electrode of a direct current source transistor $T_{10}$. Unlike the emitter electrodes of $T_5$ and $T_6$ which are directly connected to the collector electrode of $T_9$, the emitter electrodes of $T_7$ and $T_8$ are each connected through resistors $R_1$ and $R_2$ of equal value to the collector of $T_{10}$.

The DC biassing of $T_{10}$ is ensured by a resistor $R_3$ arranged between the positive supply voltage (+) and the base of $T_{10}$ and a diode $D_1$ arranged in parallel across the base-emitter junction of $T_{10}$. Diode $D_1$, together with $T_{10}$, constitutes a current mirror so that the collector current of $T_{10}$ is equal to the direct current flowing through $R_3$ and $D_1$.

The DC biassing of $T_9$ is controlled as a function of the intensity of the signal received. To this end an automatic gain control voltage V, obtained in known manner, is applied to the base electrode of an emitter follower transistor $T_{11}$. The emitter electrode of $T_{11}$ is connected through an emitter resistor $R_4$ and a diode $D_2$ to the negative supply voltage terminal (−). The base-emitter junction of a transistor $T_{12}$ is arranged in parallel across $D_2$, its collector electrode being connected to the base electrode of $T_9$. This base electrode is furthermore connected through a resistor $R_5$ to the positive supply voltage terminal (+) and through a diode $D_3$ to the negative supply voltage terminal (−).

$I_4$ is the current through $R_4$ dependent on the AGC voltage V. This current also flows through $D_2$ because the base current of $T_{12}$ is negligibly low. Since $D_2$ and $T_{12}$ constitute a current mirror, the collector current through $T_{12}$ is equal to $I_4$. When furthermore $I_5$ is the substantially constant direct current through $R_5$, a current $I_5 - I_4$ flows through $D_3$. Since $D_3$ together with $T_9$ constitutes a current mirror, the collector current of $T_9$ is also $I_5 - I_4$. Therefore, when the current $I_4$ increases from the value 0 to a value which is approximately equal to $I_5$ under the influence of the AGC voltage V, the collector current of $T_9$, which is also the supply current for the pair $T_5 - T_6$, decreases from a value $I_5$ (adjustable by $R_5$) to substantially 0.

In the case of very weak input signals at the input terminals 7–8, the current through $T_9$ is large (equal to $I_5$) and hence the amplification of the transistor pair $T_5 - T_6$ is likewise large. Since resistors do not occur in the long-tailed pair arrangement constituted by $T_5$, $T_6$ and $T_9$, the noise contribution of this circuit is at a minimum so that a minimum deterioration of the signal-to-noise ratio occurs.

In the case of an increasing input signal intensity the collector current of $T_9$ and hence the amplification of $T_5 - T_6$ decreases so that an effective gain control is obtained. When, however, the signal amplitude at the terminals 7–8 has increased to approximately the value of the temperature voltage of the transistors (approximately 26 mV), an inadmissible signal distortion occurs in the transistors $T_5$ and $T_6$. In order to prevent this, a suitable choice of $R_4$ and $R_5$ ensures that transistor $T_9$ and hence the pair $T_5$–$T_6$ is completely cut-off before this inadmissible distortion occurs. Meanwhile the amplification of the aerial signal has been taken over by the transistor pair $T_7 - T_8$. As a result of the resistors $R_1$ and $R_2$ incorporated in the emitter leads of these transistors, this transistor pair can handle much larger input signals without distortion. The phase at which transistor $T_7$ provides a signal current for the line 6 is the same as that with which the transistor $T_6$ provides a signal current for this line and likewise the phase at which $T_8$ provides a signal current for the line 5 is the same as that with which $T_5$ provides a signal current for the line 5. As a result a uniform amplification change-over from the pair $T_5 - T_6$ to the pair $T_7 - T_8$ can be effected before the point is reached where transistor pair $T_5 - T_6$ provides an inadmissible signal distortion.

The circuit of FIG. 1 has some drawbacks which may be obviated in the manner shown in FIG. 2.

A first drawback is that in the case of weak signals the resistors $R_1$ and $R_2$ apply some noise energy to the lines 5 and 6 through $T_7$ and $T_8$, respectively. This drawback may be obviated by cutting off transistor 10 in the case of weak signals and hence by cutting off transistor pair $T_7 - T_8$ and by causing these transistors to convey a current increasing with an increasing signal intensity. The transistor $T_{10}$ is then controlled in a sense opposite to that of transistor $T_9$. This may be realized in a very simple manner by omitting the resistor $R_3$ and the diode $D_1$ in the circuit of FIG. 1 and by connecting the base electrode of $T_{10}$ directly to the junction of $R_4$ and $D_2$. Diode $D_2$ and transistor $T_{10}$ then together constitute a current mirror which causes the collector current of $T_{10}$ to be equal to the current $I_4$ controlled by the AGC voltage.

Another drawback is that for a strong signal intensity the transistor $T_9$ of FIG. 1 is not completely cut off because transistor $T_{12}$ is saturated when $I_4$ becomes equal to $I_5$ and then no longer constitutes a current mirror with $D_2$. This drawback may be obviated by applying a low bias relative to the negative supply voltage to the emitter electrode of $T_9$ together with the cathode of $D_3$. This is realized in FIG. 2 by a resistor $R_6$ of relatively low value in the emitter lead of $T_9$. A current increasing with an increasing signal intensity is applied to this resistor through an emitter follower transistor $T_{13}$ controlled by the AGC voltage and a resistor $R_7$, so that a bias increasing with an increasing signal intensity is built up for transistor $T_9$ across $R_6$.

Although the circuit arrangement according to the invention is particularly suitable for use as a controlled high-frequency preamplifier, other applications are alternatively possible, for example, as a controlled low-frequency or intermediate-frequency amplifier.

What is claimed is:

1. A differential amplifier comprising first and second transistors arranged in a longtailed pair configuration having interconnected emitter electrodes, means for applying a signal to be amplified between the base electrodes of said transistors, a third transistor with its collector connected to said emitter electrodes, means connected to the base electrode of the third transistor for reducing the direct current flowing through said third transistor with increasing input signal intensity, a fourth transistor with its base electrode connected to the base electrode of the first transistor and with its collector electrode connected to the collector electrode of the first transistor, a fifth transistor with its base electrode connected to the base electrode of the second transistor and with its collector electrode connected to the collector electrode of the second transistor, and means connecting the emitter electrodes of said fourth and fifth transistors to first and second substantially equal emitter resistors, respectively.

2. A difference amplifier as claimed in claim 1, characterized in that said emitter resistors are connected to the collector electrode of a sixth transistor biased to convey a direct current.

3. A difference amplifier as claimed in claim 2, characterized in that means are connected to the base electrode of the sixth transistor for cutting off this transistor for an input signal below a given intensity and for increasing the direct current through said transistor for an increasing input signal above said given intensity.

4. A difference amplifier as claimed in claim 1 further comprising means connected to the emitter electrode of the third transistor for generating a bias voltage for cutting off said transistor upon receipt of an input signal of a relatively large signal intensity.

5. A differential amplifier comprising first and second transistors connected as a first difference amplifier stage and having interconnected emitter electrodes, a pair of input terminals adapted to receive an input signal to be amplified and coupled respectively to the base electrodes of said first and second transistors, a source of supply voltage, a third transistor with its emitter-collector path connected individually in series with the emitter-collector paths of said first and second transistors across said voltage supply to form a direct current source for said transistors, means controlled by the input signal and coupled to the base of the third transistor for controlling the direct current flowing through said third transistor as an inverse function of the amplitude of the input signal, fourth and fifth transistors connected as a second difference amplifier stage, means connecting the base and collector of the fourth transistor to the base and collector, respectively, of the first transistor, means connecting the base and collector of the fifth transistor to the base and collector, respectively, of the second transistor, and means for biasing said fourth and fifth transistors at a level so that low amplitude signals are amplified primarily by said first and second transistors whereas high amplitude signals are amplified primarily by said fourth and fifth transistors.

6. A differential amplifier as claimed in claim 5 wherein said biasing means comprise first and second substantially equal resistors connected to the emitter electrodes of said fourth and fifth transistors, respectively.

7. A differential amplifier as claimed in claim 6 wherein the emitter resistors are connected in common to the collector of a sixth transistor having a DC bias applied to its base electrode thereby to pass a direct current.

8. A differential amplifier as claimed in claim 6 wherein the emitter resistors are connected in common to the collector of a sixth transistor having a base electrode controlled by the input signal for controlling the direct current flowing through said sixth transistor as a direct function of the amplitude of the input signal.

9. A differential amplifier as claimed in claim 7 further comprising means connecting the emitter-collector path of the sixth transistor individually in series with the emitter-collector paths of said fourth and fifth transistors across said voltage supply so that the sixth transistor acts as a current source for the fourth and fifth transistors.

10. A differential amplifier as claimed in claim 5 further comprising means controlled by the input signal for biasing said third transistor into cut-off upon receipt of an input signal above a given amplitude.

11. A differential amplifier as claimed in claim 5 further comprising sixth and seventh transistors connected as a third difference amplifier stage with their emitter-collector paths in series with the emitter-collector paths of the first and second transistors across said voltage supply, eighth and ninth transistors connected as a fourth difference amplifier stage with their emitter-collector paths in series with the emitter-collector paths of the fourth and fifth transistors across said voltage supply, means connecting the collector electrodes of said sixth and seventh transistors to the collector electrodes of the eighth and ninth transistors, respectively, and means connecting the base electrodes of said sixth and seventh transistors to a second pair of input terminals and to the base electrodes of said ninth and eighth transistors, respectively.

* * * * *